(12) United States Patent
Abe et al.

(10) Patent No.: US 10,199,597 B2
(45) Date of Patent: Feb. 5, 2019

(54) LIGHT-EMITTING APPARATUS AND ILLUMINATION APPARATUS

(71) Applicant: PANASONIC INTELLECTUAL PROPERTY MANAGEMENT CO., LTD., Osaka (JP)

(72) Inventors: Masumi Abe, Osaka (JP); Toshifumi Ogata, Osaka (JP); Naoki Tagami, Osaka (JP); Toshiaki Kurachi, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/671,270

(22) Filed: Aug. 8, 2017

(65) Prior Publication Data
US 2018/0062110 A1     Mar. 1, 2018

(30) Foreign Application Priority Data
Aug. 23, 2016 (JP) .................................. 2016-162955

(51) Int. Cl.
| | |
|---|---|
| *H01L 51/52* | (2006.01) |
| *F21V 13/02* | (2006.01) |
| *H01L 27/15* | (2006.01) |
| *H01L 33/00* | (2010.01) |
| *H01L 33/20* | (2010.01) |

(Continued)

(52) U.S. Cl.
CPC .......... *H01L 51/5246* (2013.01); *F21V 13/02* (2013.01); *H01L 27/153* (2013.01); *H01L 33/0095* (2013.01); *H01L 33/20* (2013.01); *H01L 33/62* (2013.01); *H01L 51/5253* (2013.01); *H05B 33/04* (2013.01); *H01L 2224/48091* (2013.01)

(58) Field of Classification Search
CPC ... H01L 51/5246; H01L 33/62; H01L 27/153; H01L 33/0095; H01L 33/20; H01L 51/5253; H01L 2224/48091; F21V 13/02; H05B 33/04
See application file for complete search history.

(56) References Cited

U.S. PATENT DOCUMENTS

| | | | |
|---|---|---|---|
| 8,624,271 B2 * | 1/2014 | Reiherzer | ........... H01L 25/0753 257/88 |
| 2009/0166657 A1 | 7/2009 | Yamada et al. | |
| 2015/0008835 A1 | 1/2015 | Sugiura et al. | |

FOREIGN PATENT DOCUMENTS

| | | |
|---|---|---|
| JP | 2012-049519 A | 3/2012 |
| JP | 2012-227290 A | 11/2012 |
| JP | 5119917 B2 | 1/2013 |

(Continued)

*Primary Examiner* — Kevin Quarterman
(74) *Attorney, Agent, or Firm* — Greenblum & Bernstein, P.L.C.

(57) ABSTRACT

A light-emitting apparatus is provided. The light-emitting apparatus includes a substrate, a light-emitting element on the substrate, a first sealing layer which seals the light-emitting element, and a second b sealing layer. The substrate includes a base, an interconnect layer disposed on the base and electrically connected to the light-emitting element, a metal layer which covers a portion of the interconnect layer, and an electrically insulating layer which covers another portion of the interconnect layer. The second sealing layer seals a boundary between the metal layer and the electrically insulating layer.

20 Claims, 6 Drawing Sheets

(51) Int. Cl.
*H01L 33/62* (2010.01)
*H05B 33/04* (2006.01)

(56) References Cited

FOREIGN PATENT DOCUMENTS

| | | |
|---|---|---|
| JP | 2013-191667 A | 9/2013 |
| JP | 2014-107022 A | 6/2014 |
| JP | 2015-035598 A | 2/2015 |

\* cited by examiner

FIG. 6
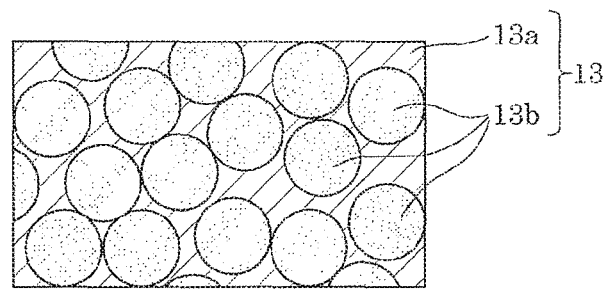
FIG. 7
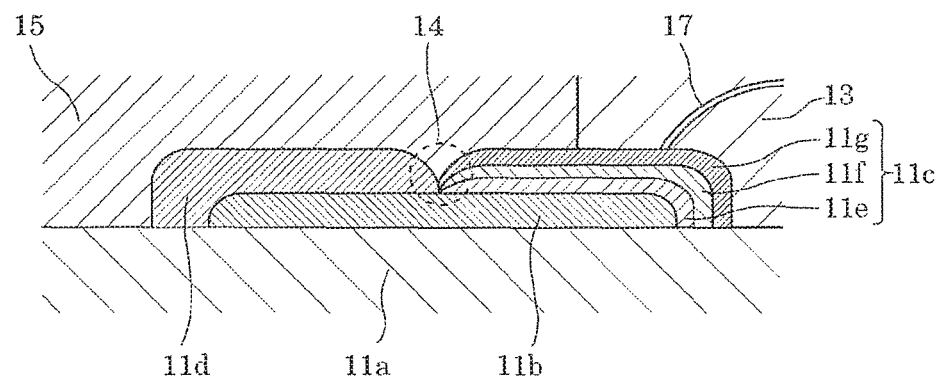
FIG. 8
| SEALING LAYER | HARDNESS | ELAPSED TIME | | | | | |
|---|---|---|---|---|---|---|---|
| | | 0 h | 85 h | 152 h | 240 h | 340 h | 450 h |
| (a) | A25 | OK | OK | NG | NG | NG | NG |
| (b) | A45 | OK | OK | OK | OK | OK | OK |
| (c) | A25 | OK | OK | OK | OK | OK | NG |
| (d) | A45 | OK | OK | OK | OK | OK | OK |

LIGHT-EMITTING APPARATUS AND ILLUMINATION APPARATUS

CROSS REFERENCE TO RELATED APPLICATION

This application claims the benefit of priority of Japanese Patent Application Number 2016-162955 filed on Aug. 23, 2016, the entire content of which is hereby incorporated by reference.

BACKGROUND

1. Technical Field

The present disclosure relates to a light-emitting apparatus having a configuration in which a light-emitting element is disposed on a substrate, and an illumination apparatus using the tight-emitting apparatus.

2. Description of the Related Art

Semiconductor light emitting elements, such as light emitting diodes (LEDs), are widely utilized as highly efficient, space-saving light sources in various illumination apparatuses for lighting applications or display applications, for example. Japanese Unexamined Patent Application Publication No. 2012-227290 discloses a light-emitting apparatus which includes, on a substrate, an LED sealed with a sealing layer.

SUMMARY

Meanwhile, in a light-emitting apparatus, an interconnect layer on a substrate may corrode due to ingress of moisture or a corrosive gas to the interconnect layer, ending up with breakage of electrical connection. Thus, enhancement of gas barrier properties is a challenge of the light-emitting apparatus.

The present disclosure provides a light-emitting apparatus having enhanced gas barrier properties and an illumination apparatus using the light-emitting apparatus.

A light-emitting apparatus according to one aspect of the present disclosure includes: a substrate; a light-emitting element on the substrate; a first sealing layer which seals the light-emitting element; and a second sealing layer, the substrate including a base, an interconnect layer disposed on the base and electrically connected to the light-emitting element, a metal layer covering a portion of the interconnect layer, and an electrically insulating layer covering another portion of the interconnect layer, wherein the second sealing layer seals a boundary between the metal layer and the electrically insulating layer.

An illumination apparatus according to one aspect of the present disclosure includes: the light-emitting apparatus; and a lighting apparatus which supplies the light-emitting apparatus with power for causing the light-emitting apparatus to emit light.

According to the present disclosure, the light-emitting apparatus having enhanced gas barrier properties and the illumination apparatus using the light-emitting apparatus are achieved.

BRIEF DESCRIPTION OF DRAWINGS

The figures depict one or more implementations in accordance with the present teaching, by way of examples only, not by way of limitations. In the figures, like reference numerals refer to the same or similar elements.

FIG. 6 is a magnified cross-sectional view illustrating a structure of a first sealing layer;

FIG. 7 is a magnified cross-sectional view of a boundary between the metal-plating layer and the glass-coated layer;

FIG. 8 shows results of evaluation on gas barrier properties of sealing layers;

DETAILED DESCRIPTION OF THE EMBODIMENTS

Hereinafter, a light-emitting apparatus, etc., according to embodiments of the present disclosure are described, with reference to the accompanying drawings. The embodiments described below are each generic and specific example of the present disclosure. Values, shapes, materials, components, and arrangement and connection between the components shown in the following embodiments are merely by way of illustration and not intended to limit the present disclosure. Moreover, among the components in the embodiments below, components not recited in any one of the independent claims defining the most generic part of the inventive concept of the present disclosure are described as arbitrary components.

Figures are schematic views and do not necessarily strictly illustrate the present disclosure. In the figures, the same reference sign is used to refer to substantially the same configuration, and duplicate description may be omitted or simplified.

Embodiment 1

[Configuration of Light-emitting Apparatus]

Figure 1:
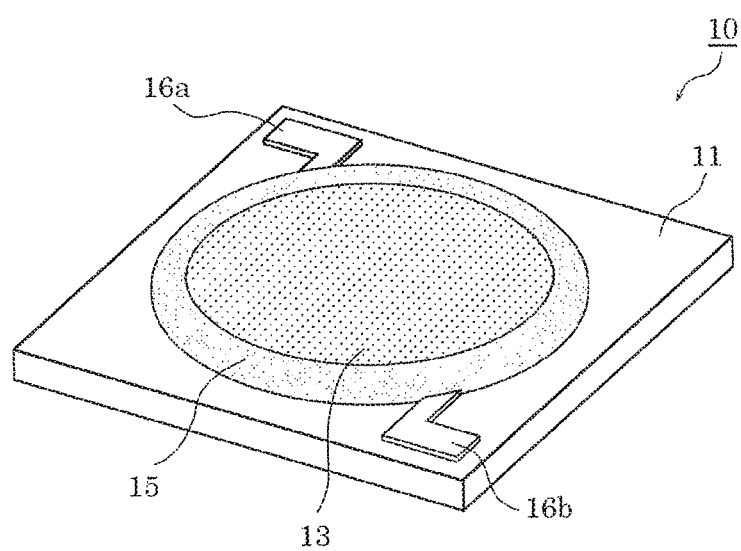
FIG. 1 is an external perspective view a light-emitting apparatus according to Embodiment 1 of the present disclosure.
Figure 2:
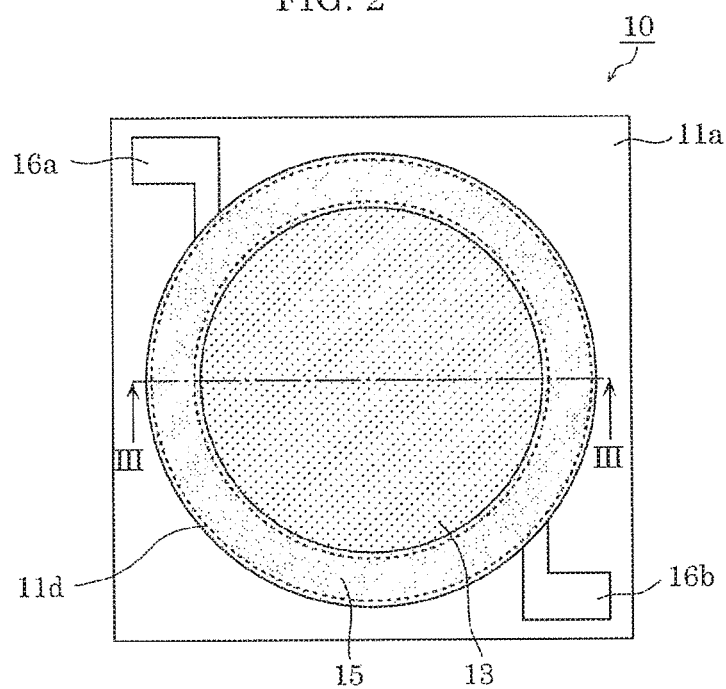
FIG. 2 is a plan view of the light-emitting apparatus according to Embodiment 1.
Figure 3:
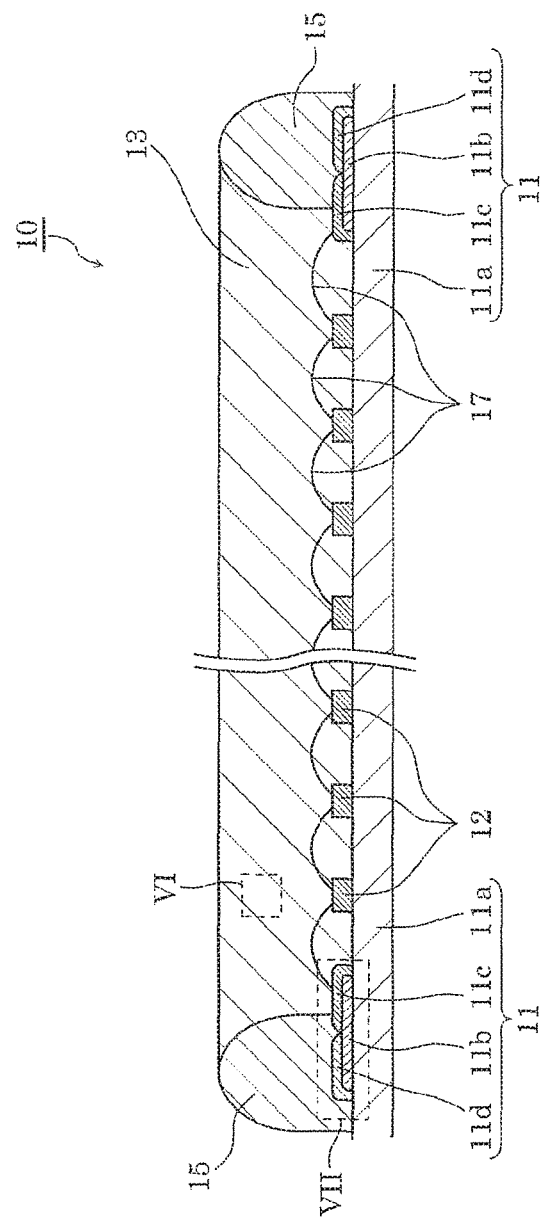
FIG. 3 is a cross-sectional view of the light-emitting apparatus, taken along a line III-III in FIG. 2.

First, a configuration of a light-emitting apparatus according to Embodiment 1 of the present disclosure is described with reference to, mainly, FIGS. 1, 2, and 3. FIG. 1 is an external perspective view of the light-emitting apparatus according to Embodiment 1. FIG. 2 is a plan view of the light-emitting apparatus according to Embodiment 1. FIG. 3 is a cross-sectional view of the light-emitting apparatus, taken along a line III-III in FIG. 2.

Light-emitting apparatus 10 is, what is known as, a COB (chip-on-beard) LED module in which LED chips 12 are directly mounted on substrate 11. As illustrated in FIGS. 1 to 3, light-emitting apparatus 10 according to Embodiment 1 includes substrate 11, LED chips 12, first sealing layer 13, second sealing layer 15, and bonding wires 17. As illustrated in FIG. 3, substrate 11 includes base 11a, interconnect layer 11b, metal-plating layer 11c, and glass-coated layer 11d. A portion of interconnect layer 11b is covered with metal-plating layer 11c, and the portion is used as, for example, electrode 16a and electrode 16b, as illustrated in FIGS. 1 and 2.

[Substrate]

Substrate 11 is a plate member on which LED chips 12 are disposed, and the plate member includes base 11a, interconnect layer 11b, metal-plating layer 11c, and glass-coated layer 11d. Examples of substrate 11 include a metal base substrate which includes a metal as base 11a, and a ceramic substrate which includes ceramics as base 11a. Alternatively, substrate 11 may be a resin substrate which includes a resin as base 11a.

If substrate 11 is a ceramic substrate, the ceramic substrate is an alumina substrate which includes aluminum oxide (alumina), or an aluminum nitride substrate which includes aluminum nitride, for example. If substrate 11 is a metal base substrate, an aluminum alloy substrate, an iron alloy substrate, a copper alloy substrate, or the like, which has, for example, an insulating film formed on its surface is employed as the metal base substrate. If substrate 11 is a resin substrate, for example, a glass-epoxy substrate which includes fiberglass and an epoxy resin is employed as the resin substrate.

For example, a substrate having a high optical reflectance (e.g., optical reflectance of 90% or more) may be employed as substrate 11. Employing a substrate having high optical reflectance as substrate 11 allows light emitted by LED chips 12 to be reflected by the surface of substrate 11. As a result, the efficiency of light-emitting apparatus 10 in extracting light is enhanced. Examples of such a substrate include a white ceramic substrate which includes alumina as a base.

Alternatively, a light-transmissive substrate having high light-transmittance may be employed as substrate 11. Examples of such a substrate include a light-transmissive ceramic substrate which includes polycrystalline alumina or aluminum nitride, a transparent glass substrate which includes glass, a quartz substrate which includes quartz, a sapphire substrate which includes sapphire, and a transparent resin substrate which includes a transparent resin material. While substrate 11 is in a rectangular shape in Embodiment 1, it should be noted that substrate 11 may be in any other shape such as a circular shape.

Interconnect layer 11b electrically connects LED chips 12. A portion of interconnect layer 11b is covered with metal-plating layer 11c, and another portion of interconnect, layer 11b is covered with glass-coated layer 11d. Interconnect layer 11b includes, for example, silver (Ag). However, interconnect layer 11b may include any other metal.

Figure 4:
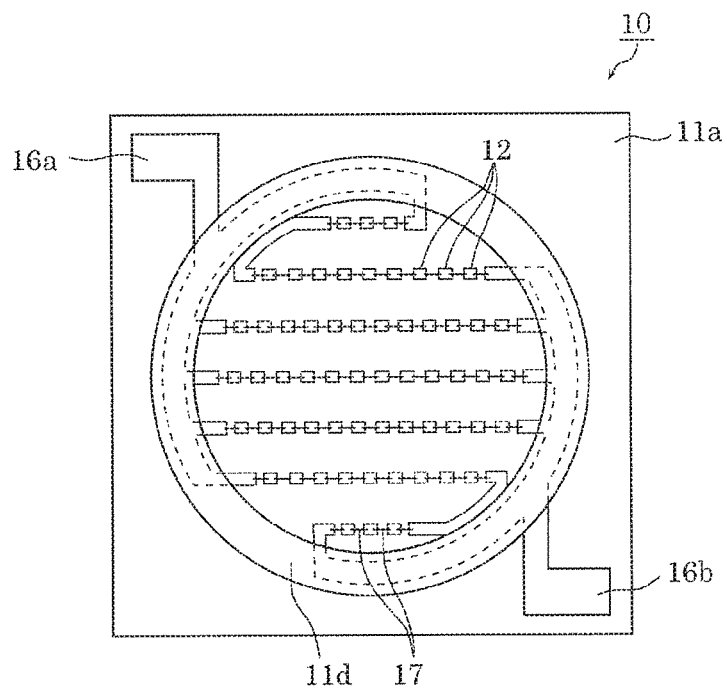
FIG. 4 is a plan view illustrating a shape of a glass-coated layer.

Glass-coated layer 11d is one example of an electrically insulating layer. As illustrated in FIG. 3, glass-coated layer 11d is positioned above interconnect layer 11b and covers a region of interconnect layer 11b that is not covered with metal-plating layer 11c. Glass-coated layer 11d also serves as an underlying layer for forming second sealing layer 15 which is formed above glass-coated layer 11d. FIG. 4 is a plan view illustrating a shape of glass-coated layer 11d. FIG. 4 is a diagram of light-emitting apparatus 10 of FIG. 2 with first sealing layer 13 and second sealing layer 15 removed.

As illustrated in FIG. 4, glass-coated layer 11d is disposed so as to cover the portion of interconnect layer 11b that is in a generally annular shape and disposed around LED chips 12. Glass-coated layer 11d, in a top view, is formed in an annular shape surrounding LED chips 12. Note than glass-coated layer 11d may be formed in a rectangular annular shape.

Glass-coated layer 11d includes a glass material and has a surface rougher than the surfaces of base 11a and interconnect layer 11b. For this reason, as compared to second sealing layer 15 when formed on base 11a or interconnect layer 11b, second sealing layer 15 formed on glass-coated layer 11d has great adhesion to substrate 11. Note that glass-coated layer 11d has a thickness of about 5 μm to about 50 μm. An increase of glass-coated layer 11d in thickness allows reduction of the amount of material used to form second sealing layer 15.

Figure 5:
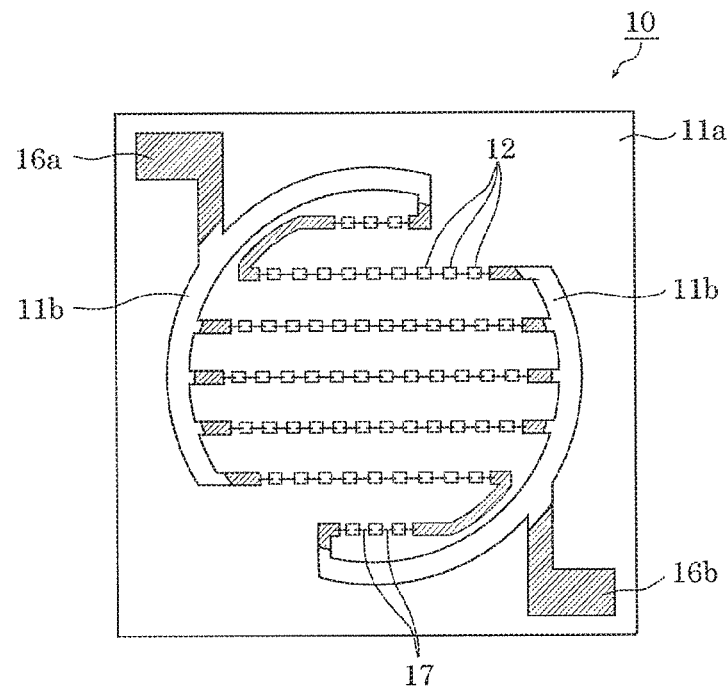
FIG. 5 is a plan view showing regions in which a metal-plating layer is formed.

Metal-plating layer 11c is one example of a metal layer. As illustrated in FIG. 3, metal-plating layer 11e is positioned above interconnect layer 11b and covers the region of interconnect layer 11b that is not covered with glass-coated layer 11d. Metal-plating layer 11c is formed on interconnect layer 11b to connect bonding wires 17. Metal-plating layer 11c is formed, specifically, in regions of interconnect layer 11b that are not covered with glass-coated layer 11d. FIG. 5 is a plan view showing the regions in which metal-plating layer 11c is formed. Metal-plating layer 11c is formed in the hatched regions of interconnect layer 11b in FIG. 5. Note that FIG. 5 is a diagram with glass-coated layer 11d in FIG. 4 removed.

The primary material forming metal-plating layer 11c is, for example, gold (Au). However, the primary material may be any other metal. A specific structure of metal-plating layer 11c is not particularly limited. Note that the portion of interconnect layer 11b covered with metal-plating layer 11c includes electrode 16a and electrode 16b. Electrodes 16a and 16b are used to supply light-emitting apparatus 10 with power from an external power supply, and are electrically connected to an output terminal of the external power supply.

[LED Chip]

LED chip 12 is one example of a light-emitting element, and is a blue LED chip which emits blue light. As LED chip 12, for example, a gallium-nitride-based LED chip is employed which includes an InGaN-based material and has a center wavelength (a peak wavelength of emission spectrum) of 430 nm or greater and 480 nm or less.

Lines of the light-emitting elements, each element configured of LED chip 12, are disposed on substrate 11. As illustrated in FIGS. 4 and 5 structurally, seven lines of light-emitting elements are disposed on substrate 11 so as to conform to a circular shape demarcated by interconnect layer 11b.

Five lines of light e fitting elements, each line including twelve LED chips 12 connected in series, are electrically disposed on substrate 11. The five lines of light-emitting elements are connected in parallel, and emit light as power is supplied between electrode 16a and electrode 16b.

Moreover, Chip To Chip electrical interconnection is established, mainly by bonding wires 17, between LED chips 12 connected in series (some of LED chips 12 are electrically connected via interconnect layer 11b). Bonding wires 17 include, for example, gold (Au). However, bonding wires 17 may include any other metal such as silver (Ag) or copper (Cu), for example. Note that light-emitting apparatus 10 may include at least one LED chip 12.

[First Sealing Layer]

First sealing layer 13 seals LED chips 12, bonding wires 17, and a portion of metal-plating layer 11c. In a plan view, first sealing layer 13 is formed in a circular shape by being dammed up by second sealing layer 15 having an annular shape. Note that the plan view refers to viewing light-emitting apparatus 10 along a direction perpendicular to the major surface of substrate 11.

As illustrated in FIG. 6, first sealing layer 13, specifically, includes light-transmissive resin material 13a containing yellow phosphor particles 13b (phosphor) as a wavelength conversion material. First sealing layer 13 is light transmissive. FIG. 6 is a magnified cross-sectional view (magnified view of region VI in FIG. 3) illustrating a structure of first sealing layer 13.

Light-transmissive resin material 13a is, for example, a silicone resin. However, light-transmissive resin material 13a may be an epoxy resin or a urea resin, for example. For example, yttrium aluminum garnet (YAG)-based phosphor particles are employed as yellow phosphor particles 13b.

According to this configuration, a portion of blue light emitted by LED chips 12 is wavelength-converted into yellow light by yellow phosphor particles 13b included in first sealing layer 13. Then, a portion of the blue light not absorbed in yellow phosphor particles 13b and the yellow light obtained by the wavelength-conversion by yellow phosphor particles 13b are diffused and mixed in first sealing layer 13. This allows white light to be emitted from first sealing layer 13. First sealing layer 13 also serves to protect LED chips 12 and bonding wires 17 from refuse, moisture, or external force, etc.

[Second Sealing Layer]

Second sealing layer 15 is mainly disposed on glass-coated layer 11d and is a different layer from first sealing layer 13. Second sealing layer 15 dams up first sealing layer 13 that is prior to being cured. Second sealing layer 15 is, stated differently, a dam member, and is positioned adjacent to first sealing layer 13.

For example, a thermoset resin, a thermoplastic resin, or the like which has insulation properties is employed for second sealing layer 15. More specifically, a silicone resin, a phenolic resin, an epoxy resin, a Bismaleimide-Triazine resin, a polyphthalamide (PPA) resin, or the like is employed for second sealing layer 15.

Desirably, second sealing layer 15 has optical reflectivity in order to enhance the efficiency of light-emitting apparatus 10 in extracting light. Thus, a white resin (resin containing a white pigment, for example) is employed for second sealing layer 15 in Embodiment 1. Note that second sealing layer 15 may include particles of $TiO_2$, $Al_2O_3$, $ZrO_2$, MgO, etc., in order to enhance the optical reflectivity of second sealing layer 15.

In light-emitting apparatus 10, second sealing layer 15 is, in a top view, formed in an annular shape surrounding LED chips 12. This achieves enhancement in efficiency of light-emitting apparatus 10 in extracting light. Note that dam member 15 may be formed in an annular shape having a rectangular outline, as with glass-coated layer 11d.

Note that second sealing layer 15 according to Embodiment 1 is free from phosphor particles. Moreover, LED chips 12 are not disposed within second sealing layer 15 and thus second sealing layer 15 does not seal LED chips 12. However, second sealing layer 15 may contain phosphor particles and seal LED chips 12.

[Gas Barrier Properties of Light-Emitting Apparatus]

A problem with light-emitting apparatus 10 is low gas barrier properties of second sealing layer 15 at a boundary between metal-plating layer 11c and glass-coated layer 11d. FIG. 7 is a magnified cross-sectional view of the boundary between metal-plating layer 11c and glass-coated layer 11d (a magnified view of the region VII in FIG. 3). Note that metal-plating layer 11c is described, with reference to FIG. 7, as having a three-layer structure which includes, from bottom up, nickel 11e, palladium 11f, and gold 11g. In other words, metal-plating layer 11c is a Ni/Pd/Au-plating layer.

During the manufacture of substrate 11, interconnect layer 11b is printed on base 11a and then glass-coated layer 11d is formed so as to cover the portion of interconnect layer 11b. Glass-coated layer 11d is formed by firing substrate 11 having a glass paste printed thereon. Then, metal-plating layer 11c is formed, by a plating process, in regions of interconnect layer 11b, the regions being different from the region in which glass-coated layer 11d is formed.

In doing so, due to the way of manufacture, a portion of metal-plating layer 11c adjacent to glass-coated layer 11d is thinner and has reduced gas barrier properties than the other. As a result, reliability of light-emitting apparatus 10 reduces in environment of moisture and a corrosive gas which corrodes interconnect layer 11b. Specifically, nickel 11e, palladium 11f, and interconnect layer 11b (silver), which have lower standard electrode potentials than gold 11g corrode by galvanic corrosion. Consequently, interconnect layer 11b may be broken.

Thus, in light-emitting apparatus 10, second sealing layer 15, that is usually formed over glass-coated layer 11d, extends over boundary 14. In other words, second sealing layer 15 is disposed across metal-plating layer 11c and glass-coated layer 11d, sealing boundary 14 between metal-plating layer 11c and glass-coated layer 11d.

As illustrated in FIGS. 4 and 5 above, in the plan view, boundary 14 (without the reference sign in FIGS. 4 and 5) is the arcuate line between metal-plating layer 11e and glass-coated layer 11d. In the plan view, second sealing layer 15 has an annular shape, seals boundary 14, and surrounds first sealing layer 13.

As such, by sealing boundary 14 with second sealing layer 15, the gas barrier properties of boundary 14 are enhanced, thereby inhibiting corrosion of interconnect layer 11b.

Note that second sealing layer 15 should be hard from the standpoint of enhancement of the gas barrier properties of boundary 14. For example, second sealing layer 15 may have a type A durometer hardness of 45 or greater. The durometer hardness, as used herein, refers to a type A durometer hardness according to JIS K 6253-3. FIG. 8 shows results of evaluation on the gas barrier properties of sealing layers.

The results of evaluation shown in FIG. 8 indicate occurrence or absence of failure (unlit) of LED chips 12 when the sealed area of light-emitting apparatus 10 (the area in which first sealing layer 13 and second sealing layer 15 are disposed) is sealed with four types of sealing layers and left standing in environment where an environmental temperature is 40 degrees Celsius and humidity is 95%. The atmosphere in the above environment contains, as the corrosive gas, 2 ppm of hydrogen sulfide and 4 ppm of nitrogen dioxide. Note that the evaluation was carried out while the portion not sealed with the sealing layers (for example, electrode 16a and electrode 16b) is protected by a polyimide tape.

The four types of sealing layers are different types (product numbers) of silicone resins. "OK" in FIG. 8 indicates that all of LED chips 12 successfully emitted light even after being left standing. "NG" indicates that at least some of LED chips 12 did not emit light after being left standing (i.e., interconnect layer 11b was broken).

For the sealing layer (a), all of LED chips 12 successfully emitted light up to when the sealing layer (a) was left standing for 85 hours. However, at least some of LED chips 12 did not emit light after the sealing layer (a) was left standing for 152 hours or longer. The sealing layer (a) has a type A durometer hardness of 25.

For the sealing layer (b), all of LED chips 12 successfully emitted light even though the sealing layer (b) was left standing for 450 hours. The sealing layer (b) has a type A durometer hardness of 45.

For the sealing layer (c), all of LED chips 12 successfully emitted light up to when the sealing layer (c) was left standing for 340 hours. However, at least some of LED chips 12 did not emit light when the sealing layer (c) was left standing for 450 hours. The sealing layer (c) has a type A durometer hardness of 25.

For the sealing layer (d), all of LED chips 12 successfully emitted light even though the sealing layer (d) was left standing for 450 hours. The sealing layer (d) has a type A durometer hardness of 45.

These results of evaluation indicate that a harder sealing layer tends to have higher gas barrier properties. For this reason, for example, second sealing layer 15 may have a type A durometer hardness of 45 or greater. This yields a low effect of causing breakage of interconnect layer 11b even if the sealing layer is left standing in the above environment for 450 hours or longer.

Note that second sealing layer 15 may include, for example, a gas adsorbent in order to enhance the gas barrier properties of second sealing layer 15. Zeolite is one example of the gas adsorbent. If second sealing layer 15 includes the gas adsorbent, second sealing layer 15 may include a black resin (resin containing a black pigment, for example) in order to mitigate effects of the gas adsorbent on light.

Moreover, second sealing layer 15 may include a transition metal that has an effect of enhancing the gas barrier properties of second sealing layer 15. Second sealing layer 15 is, specifically, a metallic soap which includes a rare earth element such as rare earth-OCTOATE 6% produced by DIC Corporation. Note that the rare earth element is included in transition metals. Moreover, second sealing layer 15 may include a metallic soap (a metallic soap which includes metal octoate) that has, as a metal, a transition metal such as NIKKA OCTHIX iron produced by Nihon Kagaku Sangyo Co., Ltd.

Moreover, second sealing layer 15 may include a phenyl-based silicone resin having as barrier properties higher than a methyl-based silicone resin.

Moreover, if a silicone resin is employed for second sealing layer 15, the silicone resin may be an addition reaction-type silicone resin. Since the addition reaction-type silicone resin hardly shrinks upon curing, less bubbles are formed in the addition reaction-type silicone resin than a condensation-type silicone resin which shrinks upon curing. Thus, if second sealing layer 15 includes the addition reaction-type silicone resin, the reduction of the gas barrier properties due to formation of bubbles is inhibited.

Note that first sealing layer 13 should have enhanced gas barrier properties as well, in order to inhibit deterioration of yellow phosphor particles 13b. Thus, as with second sealing layer 15, first sealing layer 13 may be enhanced in gas barrier properties by including a gas adsorbent, such as the aforementioned zeolite, or a transition metal, in first sealing layer 13. First sealing layer 13 may include a phenyl-based silicone resin, or may include an addition reaction-type silicone resin.

Moreover, a rigid material may be employed also for first sealing layer 13. However, if first sealing layer 13 is hard, bonding wires 17 may be broken by shrinking of first sealing layer 13 due to temperature variations. For this reason, a soft material may be employed for first sealing layer 13, and a rigid material may be employed for second sealing layer 15. In other words, second sealing layer 15 may be harder than first sealing layer 13.

[Effects]

As described above, light-emitting apparatus 10 includes substrate 11, LED chips 12 on substrate 11, first sealing layer 13 which seals LED chips 12, and second sealing layer 15. Substrate 11 includes base 11a, interconnect layer 11b disposed on base and electrically connected to LED chips 12, metal-plating layer 11c which covers a portion of interconnect layer 11b, and glass-coated layer 11d which covers another portion of interconnect layer 11b. Second sealing layer 15 seals boundary 14 between metal-plating layer 11e and glass-coated layer 11d. LED chips 12 are each one example of the light-emitting element. Metal-plating layer 11c is one example of the metal layer. Glass-coated layer 11d is one example of the electrically insulating layer.

According to this, ingress of moisture and a corrosive gas from boundary 14 to interconnect layer 11b can be inhibited by second sealing layer 15. In other words, the gas barrier properties of light-emitting apparatus 10 can be enhanced.

Moreover, second sealing layer 15 may be harder than first sealing layer 13.

According to this, ingress of moisture and a corrosive gas from boundary 14 to interconnect layer 11b can further be inhibited by second sealing layer 15. In other words, the gas barrier properties of light-emitting apparatus 10 can further be enhanced. Stated differently, reliability of light-emitting apparatus 10 can be enhanced.

Moreover, second sealing layer 15 may have a type A durometer hardness of 45 or greater.

According to this, ingress of moisture and a corrosive gas from boundary 14 to interconnect layer 11b can further be inhibited by second sealing layer 15. In other words, the gas barrier properties of light-emitting apparatus 10 can further be enhanced.

Moreover, first sealing layer 13 and second sealing layer 15 clay include an addition reaction-type silicone resin.

According to this, the tendency for bubbles to form is reduced in first sealing layer 13 and second sealing layer 15. Thus, the gas barrier properties of first sealing layer 13 and second sealing layer 15 are enhanced.

Moreover, at least one of first sealing layer 13 and second sealing layer 15 may include a transition metal.

According to this, the gas barrier properties of second sealing layer 15 are enhanced by the transition metal.

Moreover, boundary 14 may be a line between metal-plating layer 11c and glass-coated layer 11d, metal-plating layer 11 having an arcuate shape in a plan view, and in the plan view, second sealing layer 15 may have an annular shape and seal boundary 14, second sealing layer 15 surrounding first sealing layer 13.

According to this, ingress of moisture and a corrosive gas from boundary 14 to interconnect layer 11b can be inhibited, making use of second sealing layer 15 that serves as a dam member surrounding first sealing layer 13.

Moreover, the metal layer may include gold, and the electrically insulating layer may include glass.

According to this, ingress of moisture and a corrosive gas to interconnect layer 11b from boundary 14 between the metal layer, which includes gold, and the electrically insulating layer, which includes glass, can be inhibited by second sealing layer 15.

Embodiment 2

Figure 9:
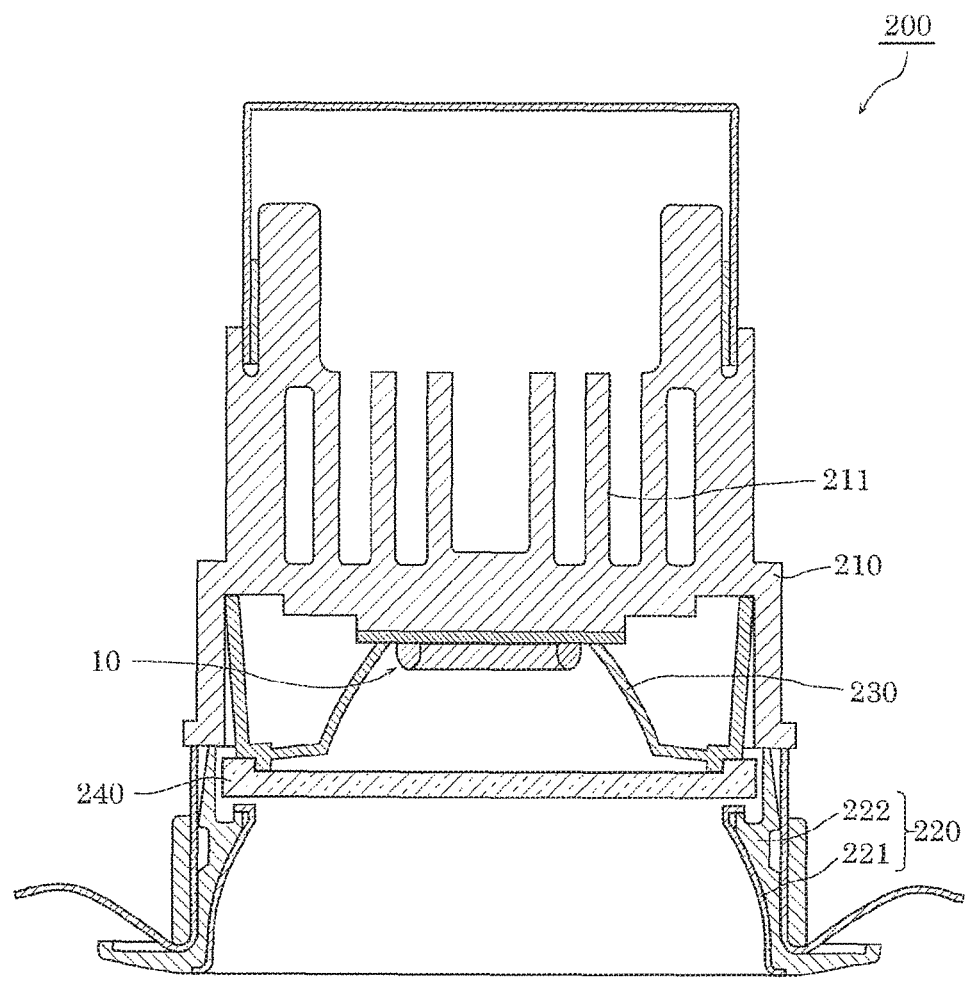
FIG. 9 is a cross-sectional view of an illumination apparatus according to Embodiment 2 of the present disclosure.
Figure 10:
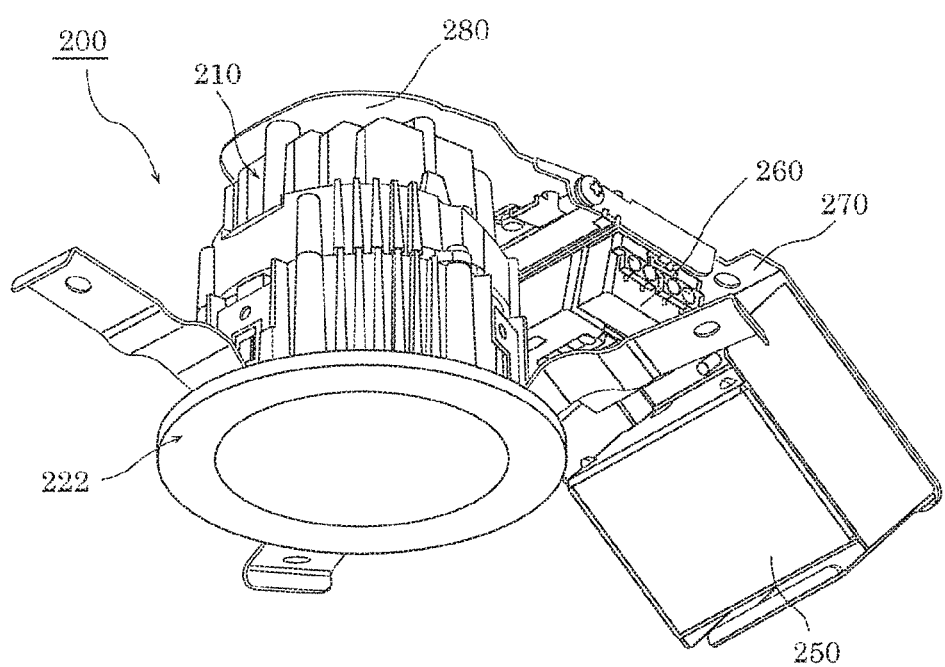
FIG. 10 is an external perspective view of the illumination apparatus and its peripheral components according to Embodiment 2.

Embodiment 2 of the present disclosure, an illumination apparatus which includes light-emitting apparatus 10 is described with reference to FIGS. 9 and 10. FIG. 9 is a cross-sectional view of the illumination apparatus according to Embodiment 2. FIG. 10 is an external perspective view of the illumination apparatus and its peripheral components according to Embodiment 2.

As illustrated in FIGS. 9 and 10, illumination apparatus 200 according to Embodiment 2 is, for example, a built-in illumination apparatus, such as a downlight, which is recessed in the ceiling in a house, for example, and emits light in a down direction (to a hallway, a wall, etc.).

Illumination apparatus 200 includes light-emitting apparatus 10. Illumination apparatus 200 further includes a body having a generally-closed-end cylindrical shape, reflector 230, and light-transmissive panel 240 which are disposed on the body. The body is configured by coupling base 210 and frame member 220 with each other.

Base 210 is a mounting base on which light-emitting apparatus 10 is mounted, and serves also as a heat sink for dissipating heat generated by light-emitting apparatus 10. Base 210 is formed in a substantially cylindrical shape, using a metallic material. Base 210 includes aluminum in Embodiment 2.

On top of base 210 (a portion on the ceiling side), heat dissipating fins 211 extending upward are disposed, spaced apart at regular intervals along one direction. This allows efficient dissipation of the heat generated by light-emitting apparatus 10.

Frame member 220 includes cone 221 having a substantially-cylindrical shape, and includes a reflective inner surface and frame body 222 on which cone 221 is mounted. Cone 221 includes a metallic material. Cone 221 can be formed by drawing or press forming of aluminum alloy, for example. Frame body 222 includes a rigid resin material or a metallic material. Frame member 220 is secured by frame body 222 mounted on base 210.

Reflector 230 is a ring-shaped (a funnel-shaped) reflective member having internal reflectivity. Reflector 230 can include a metallic material, such as aluminum, for example. Note that reflector 230 may also include a rigid white resin material, rather than using a metallic material.

Light-transmissive panel 240 is a light-transmissive member that is light diffusible and light transmissive. Light-transmissive panel 240 is a flat plate disposed between reflector 230 and frame member 220, and mounted on reflector 230. Light-transmissive panel 240 can be formed in a disk shape, using a transparent resin material, such as acrylic or polycarbonate.

Note that illumination apparatus 200 may not include light-transmissive panel 240. Without light-transmissive panel 240, illumination apparatus 200 can improve the luminous flux of light emitted from illumination apparatus 200.

Also as shown in FIG. 10, illumination apparatus 200 is connected to lighting apparatus 250 which supplies light-emitting apparatus 10 with power for causing light-emitting apparatus 10 to emit light, and terminal base 260 which relays an alternating-current power from mains supply to lighting apparatus 250. Lighting apparatus 250, specifically, converts alternating-current power that is relayed from terminal base 260 into direct-current power and outputs the direct-current power to light-emitting apparatus 10.

Lighting apparatus 250 and terminal base 260 are secured to mounting plate 270 that provided separately from the body. Mounting plate 270 is formed by bending a rectangular plate member which includes a metallic material. Lighting apparatus 250 is secured onto the undersurface of one end portion of mounting plate 270, and terminal base 260 is secured onto the undersurface of the other end portion. Mounting plate 270 is connected to top plate 280 secured on top of base 210 of the body.

As described above, illumination apparatus 200 includes light-emitting apparatus 10 and lighting apparatus 250 which supplies light-emitting apparatus 10 with power for causing light-emitting apparatus 10 to emit light. The gas barrier properties of light-emitting apparatus 10 can be enhanced in such an illumination apparatus 200 as well.

While the downlight is illustrated as the illumination apparatus according to the present disclosure in Embodiment 2, the present disclosure may be implemented as any other illumination apparatus, such as a spot light.

Other Embodiments

While the light-emitting apparatus and the illumination apparatus have been described above, the present disclosure is not limited to the embodiments described above.

While the metal-plating layer is illustrated as an example of the metal layer in the above embodiments, the metal layer is not limited to the metal-plating layer. The metal layer may cover the portion of the interconnect layer by processing, such as vapor deposition or printing, other than by a plating process.

Moreover, while the glass-coated layer is illustrated as an example of the electrically insulating layer in the above embodiments, the electrically insulating layer is not limited to the glass-coated layer. The electrically insulating layer may include any electrically insulating material. The electrically insulating layer may be, for example, a cover resist which includes polyimide, for example, and covers the interconnect layer.

Moreover, while the glass-coated layer and the second sealing layer are formed in the annular shapes surrounding the LED chips in the above embodiments, the shapes, etc. of the glass-coated layer and the second sealing layer are not particularly limited. For example, the glass-coated layer and the second sealing layer may be formed in rectangular annular shapes.

Moreover, while in the above embodiments, the light-emitting apparatus provides white light by a combination of the LED chips which emit blue light and the yellow phosphor particles, the configuration for providing white light is not limited thereto.

For example, LED chips 12 which emit blue light, red phosphor particles, and green phosphor particles may be combined. Alternatively, an ultraviolet LED chip, blue phosphor particles, green phosphor particles, and red phosphor particles may be combined. The ultraviolet LED chips emit ultraviolet light having shorter wavelengths than LED chips 12 which emit blue light. The blue phosphor particles, the green phosphor particles, and the red phosphor particles, respectively, emit blue light, red light, and green light when excited mainly by ultraviolet light.

Moreover, in the above embodiments, the Chip To Chip connection is established, by the bonding wires, between the LED chips mounted on the substrate. The LED chips, however, may be connected to the interconnect layer on the substrate by the bonding wires, and electrically connected to one another via the interconnect layer.

Moreover, in the above embodiments, the LED chips are illustrated as light-emitting elements included in the light-emitting apparatus. However, the light-emitting element may be a semiconductor light-emitting element, such as a semiconductor laser, or any other type of solid-state light emitting element, such as an electro-luminescent (EL) element, including, for example, an organic EL element and an inorganic EL element.

Moreover, the light-emitting apparatus may include two or more types of the light-emitting elements having different emission colors. For example, in addition to the LED chip which emits blue light, the light-emitting apparatus may include an LED chip which emits red light, for the purposes of enhancing color rendering.

In other instances, various modifications to the embodiments according to the present disclosure described above that may be conceived by those skilled in the art and embodiments implemented by any combination of the components and functions shown in the embodiments are also included within the scope of the present disclosure, without departing from the spirit of the present disclosure.

What is claimed is:

1. A light-emitting apparatus, comprising:
a substrate;
a light-emitting element on the substrate;
a first sealing layer which seals the light-emitting element; and
a second sealing layer,
the substrate including
a base,
an interconnect layer disposed on the base and electrically connected to the light-emitting element,
a metal layer covering a portion of the interconnect layer, and
an electrically insulating layer covering another portion of the interconnect layer, wherein
the second sealing layer seals a boundary between the metal layer and the electrically insulating layer and a portion of the metal layer adjacent to the boundary, and
a thickness of the portion of the metal layer decreases in a direction toward the electrically insulating layer.

2. The light-emitting apparatus according to claim 1, wherein
the second sealing layer is harder than the first sealing layer.

3. The light-emitting apparatus according to claim 1, wherein
the second sealing layer has a type A durometer hardness of 45 or greater.

4. The light-emitting apparatus according to claim 1, wherein
each of the first sealing layer and the second sealing layer includes an addition reaction-type silicone resin.

5. The light-emitting apparatus according to claim 1, wherein
at least one of the first sealing layer and the second sealing layer includes a transition metal.

6. The light-emitting apparatus according to claim 1, wherein
the boundary is a line between the metal layer and the electrically insulating layer, the line having an arcuate shape in a plan view, and
in the plan view, the second sealing layer has an annular shape and seals the boundary, the second sealing layer surrounding the first sealing layer.

7. The light-emitting apparatus according to claim 1, wherein
the metal layer includes gold, and
the electrically insulating layer includes glass.

8. The light-emitting apparatus according to claim 1, wherein
in a top view, the electrically insulating layer has an annular shape and surrounds the light-emitting element.

9. The light-emitting apparatus according to claim 8, wherein
in the top view, the metal layer is intermittently disposed along an inner periphery of the electrically insulating layer,
whereby the boundary is intermittently disposed along the inner periphery of the electrically insulating layer.

10. The light-emitting apparatus according to claim 9, wherein
the light-emitting element includes groups of light emitters,
the light emitters of each of the groups are connected in series, and
each of the groups extends between two portions of the metal layer which are intermittently disposed along the inner periphery of the electrically insulating layer.

11. The light-emitting apparatus according to claim 10, wherein
the groups of the light emitters are connected in parallel.

12. The light-emitting apparatus according to claim 1, wherein
the electrically insulating layer includes a surface rougher than surfaces of the base and the interconnect layer for adhering to the second sealing layer.

13. The light-emitting apparatus according to claim 1, wherein
the second sealing layer is different from the first sealing layer, positioned adjacent an outer periphery of the first sealing layer, surrounds the first sealing layer, and dams up the first sealing layer.

14. The light-emitting apparatus according to claim 13, wherein
the light-emitting element is configured to emit light of a first color;
the first sealing layer includes phosphor which is excitable by the light emitted by the light-emitting element, the phosphor being configured to wavelength-convert a first portion of the light emitted by the light-emitting element into second light of a second color, and
the first sealing layer is configured to diffuse and mix the second light and a second portion of the light emitted by the light-emitting element which is not wavelength-converted by the phosphor to emit a third light of a third color, the third color being different from the first color and the second color.

15. The light-emitting apparatus according to claim 14, wherein
the second sealing layer includes phosphor which is excitable by the light emitted by the light-emitting element.

16. The light-emitting apparatus according to claim 14, wherein
the second sealing layer includes at least one of a transition metal, a metallic soap which includes a rare earth element, or a metallic soap which includes a transition metal.

17. The light-emitting apparatus according to claim 16, wherein
the first sealing layer includes a gas adsorbent.

18. The light-emitting apparatus according to claim 1, wherein
the metal layer includes a three-layer structure of nickel, palladium, and gold.

19. An illumination apparatus, comprising:
the light-emitting apparatus according to claim 1; and a lighting apparatus which supplies the light-emitting apparatus with power for causing the light-emitting apparatus to emit light.

20. A method of manufacturing a light-emitting apparatus, the method comprising:
   preparing a base, a light-emitting element being on the base;
   printing an interconnect layer on the base;
   forming an electrically insulating layer to cover a first portion of the interconnect layer;
   forming a metal layer to cover a second portion of the interconnect layer different than the first portion of the interconnect layer, a boundary being formed between the metal layer and the electrically insulating layer;
   forming a second sealing layer on the electrically insulating layer and a first portion of the metal layer adjacent to the boundary to seal the boundary and the first portion of the metal layer and to define a dam;
   establishing an electrical interconnection between the light-emitting element and the interconnect layer via bonding wires connected to the metal layer; and
   forming a first sealing layer adjacent the dam defined by the second sealing layer to seal the light-emitting element, the bonding wires, and a second portion of the metal layer different than the first portion of the metal layer,
   wherein a thickness of the first portion of the metal layer decreases in a direction toward the electrically insulating layer.

* * * * *